United States Patent
Yoo et al.

[11] Patent Number: 5,861,673
[45] Date of Patent: Jan. 19, 1999

[54] METHOD FOR FORMING VIAS IN MULTI-LEVEL INTEGRATED CIRCUITS, FOR USE WITH MULTI-LEVEL METALLIZATIONS

[75] Inventors: Chue-San Yoo; Jin-Yuan Lee, both of Hsin-Chu, Taiwan

[73] Assignee: Taiwan Semiconductor Manufacturing Company, Hsin-Chu, Taiwan

[21] Appl. No.: 787,894

[22] Filed: Jan. 23, 1997

Related U.S. Application Data

[63] Continuation of Ser. No. 558,493, Nov. 16, 1995, abandoned.

[51] Int. Cl.$^6$ .................................................. H01L 29/41
[52] U.S. Cl. ......................... 257/758; 438/626; 438/631; 438/666
[58] Field of Search ..................... 438/624, 626, 438/637, 666, 669, 631; 257/758, 759, 756, 765, 763

[56] References Cited

U.S. PATENT DOCUMENTS

| | | | |
|---|---|---|---|
| 4,708,770 | 11/1987 | Pasch | 156/662 |
| 4,874,719 | 10/1989 | Kurosawa | 437/195 |
| 4,917,759 | 4/1990 | Fisher et al. | 156/643 |
| 5,312,512 | 5/1994 | Allman et al. | 156/636 |
| 5,346,411 | 9/1994 | Pasch | |
| 5,364,818 | 11/1994 | Ouellet | 437/195 |
| 5,471,091 | 11/1995 | Pasch et al. | 257/752 |
| 5,512,514 | 4/1996 | Lee | 437/195 |

FOREIGN PATENT DOCUMENTS

| | | |
|---|---|---|
| 2-231742 | 9/1990 | Japan . |
| 4-127452 | 4/1992 | Japan . |

*Primary Examiner*—Caridad Everhart
*Attorney, Agent, or Firm*—George O. Saile; Stephen B. Ackerman

[57] ABSTRACT

A process has been developed that allows reliable fabrication of vias, used for multi-level wiring purposes. The process features the use of a metallization structure, overlying a pillar structure in a specific area, resulting in a raised and extended metal surface, in areas of overlap. The raised and extended metal surface is used for subsequent via contact. Spin on glass processes are also employed to fill narrow spaces between metal structures.

26 Claims, 4 Drawing Sheets

METHOD FOR FORMING VIAS IN MULTI-LEVEL INTEGRATED CIRCUITS, FOR USE WITH MULTI-LEVEL METALLIZATIONS

This invention, Ser. No. 08/787,894, is a continuation of Ser. No. 08/558,493, originally filed Nov. 16, 1995 now abandoned.

BACKGROUND OF THE INVENTION

(1) Field of the Invention

This invention relates to the methods used to fabricate semiconductor devices, and more specifically to a method of planarizing semiconductor structures using spin on glass and etch back processes.

(2) Description of Prior Art

The trend in the semiconductor industry has been to continually increase device performance, while still maintaining or decreasing the cost of semiconductor devices. These objectives have been partially satisfied by microminiaturazation, or the ability to produce semiconductor devices with sub-micron features. Advances in the photolithographic discipline, in terms of more sophisticated exposure cameras, as well as the development of more sensitive photoresist materials have allowed sub-micron images in photoresist to be routinely achieved. In addition similar advances in the dry etching discipline has allowed the sub-micron images in photoresist to be successfully defined, in underlying materials that are used in the fabrication of semiconductor chips.

The use of sub-micron features however, can create new problem areas that have to be addressed by the semiconductor engineering community. For example the use of sub-micron metal interconnects, with sub-micron spaces between metal interconnects, has created a problem in terms of using standard dielectric passivation processes to successfully insulate specific metal interconnects. To satisfy the conductivity, as well as the reliability requirements, in terms of current density for electromigration resistance, the narrower metal interconnects have to be thicker. This together with the narrower spaces now used between metal lines, result in aspect ratios that conventional insulator deposition processes have difficulty in successfully filling. Several processes, such as the use of spin on glass, (SOG), and chemical mechanical polishing, (CMP), have been used in an attempt to solve the problem of filling narrow spaces between metal interconnect lines. For example Allman, et al, in U.S. Pat. No. 5,312,512, describe the use of both SOG deposition, and CMP planarazation processes, in the fabrication of integrated circuits using multi-level metallizations.

Another problem encountered with narrow metal lines is the ability to successfully fabricate the connection between overlying and underlying metallization levels. Via holes, created in the dielectric layer used between metallization levels, filled with a metal, are normally used for this purpose. However to reliably create the metal filled via, a large surface area of the underlying metallization level is needed to guarantee that the via totally resides on the underlying metallization level. This increased layout demand negatively impacts semiconductor device packing density, ultimately resulting in less semiconductor chips being fabricated from a specific diameter, starting substrate. The use of a pillar technology increases, or extends the available surface area of the underlying metallization level, enabling successful via hole formation to occur. Fisher, et al, in U.S. Pat. No. 4,917,759, describe the use of a pillar technology, for use in the formation of vias, to be used to connect metallization levels. However these inventions, Fisher, et al, as well as Allman, et al, do not teach the processes needed to fabricate advanced semiconductor devices. This invention will feature a metal pillar, with an overlying metallization layer, used to extend the available surface area of this metallization level in terms of accepting a via hole. This invention also features the use of SOG insulation, for purposes of filling narrow spaces between metal features, and dry etching processing for etching back the SOG layer. However in this invention the porous SOG layer is passivated during subsequent via hole openings, as well as during subsequent metal depositions, thus not allowing deleterious outgassing to occur, which can adversely influence the properties of the depositing metal.

SUMMARY OF THE INVENTION

It is an object of this invention to use a metal, or dielectric pillar, underlying a first level metallization structure, to raise the structure, in the area in which it overlies the metal pillar, and to extend the surface area of the raised, first level metallization structure, for purposes of using this raised, extended surface, for via hole contacts.

It is another object of this invention to use a spin on glass layer, as part of a dielectric composite, to fill the narrow spaces between first level metallization level structures.

It is yet another object of this invention to use dry etching processing to etch back the spin on glass layer, on the raised portion of the first level metallization structure, to expose the extended surface of the first level metallization structure.

It is still yet another object of this invention to passivate the spin on glass layer, with a chemically vapor deposited dielectric layer, so that deleterious outgassing from the spin on glass layer does not occur during via hole etching or during metal depositions.

In accordance with the present invention a method is described for forming a via hole in a dielectric layer, in which the via is opened to a surface of an underlying metallization layer. The surface area of the metallization layer is raised and extended, in the area to be used for the subsequent via, by placing the metallization layer on an underlying metal pillar. The process initiates by deposition of a metal layer on a dielectric layer, used to passivate underlying semiconductor devices. A metal pillar is formed via standard photolithographic and reactive ion etching processes. A first level metallization layer is deposited on semiconductor devices, in opened contact holes in the dielectric layer, and on the metal pillar. Standard photolithographic and reactive ion etching processing is again performed to create a first level metallization structure. A first plasma deposited silicon oxide layer is used, for purposes of passivating the underlying first level metallization structure, followed by an application of a spin on glass layer, used to fill the spaces between first level metallization structures. Bake out and curing treatments are next performed to density the spin on glass layer. The spin on glass layer is than subjected to an etchback, to a point where the extended surface, of the raised portion of the first level metallization structure, residing on the underlying metal pillar, is exposed. A second plasma silicon oxide layer is deposited, passivating the exposed, spin on glass layer. A via hole in the second plasma silicon oxide is formed, opened to the extended surface, raised portion of the first level metallization structure. Another metallization is deposited and patterned to form the second level metallization structure.

BRIEF DESCRIPTION OF THE DRAWINGS

The object and other advantages of this invention are best described in the preferred embodiment with reference to the attached drawings that include.

DESCRIPTION OF THE PREFERRED EMBODIMENTS

The method of forming a via in a dielectric layer, to a underlying metallization structure, which in turn resides on an underlying metal pillar resulting in a raised, and extended surface, will now be covered in detail. This invention can be used for multi-level metallizations used for the fabrication of MOSFET devices currently being manufactured in industry, therefore only the specific areas unique to understanding this invention will be covered in detail.

Figure 1:
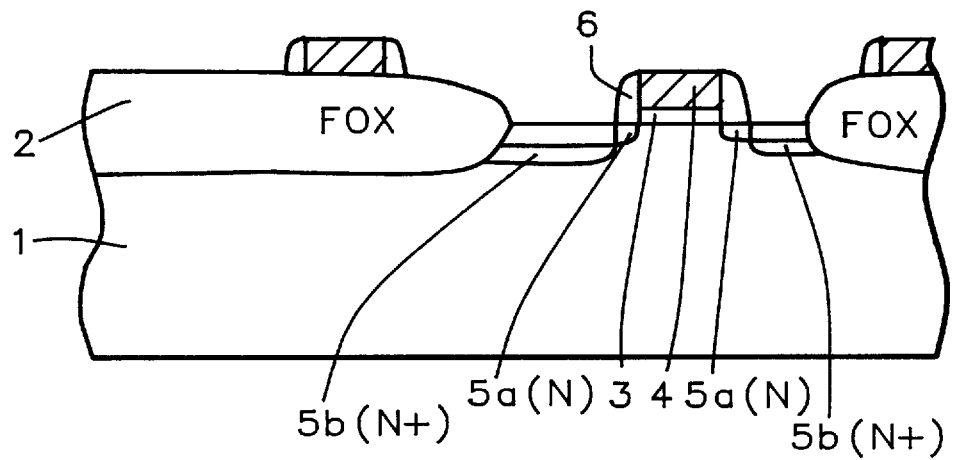
FIG. 1, which schematically, in cross-sectional style, shows a typical metal oxide semiconductor field effect transistor, (MOSFET), device, prior to multi-level metallization processing.

A typical N channel, MOSFET device, to be fabricated using the via process described in this invention, is shown schematically in FIG. 1. A P type substrate, 1, consisting of single crystalline silicon, with a <100> orientation, is used. Thick field oxide regions, 2, are grown for purposes of isolation. Briefly the process used to create the FOX region is to initially pattern a composite oxidation mask of an overlying silicon nitride layer and an underlying silicon dioxide layer. The underlying silicon dioxide layer is thermally grown to a range between about 50 to 500 Angstroms, while the silicon nitride layer is deposited using either low pressure chemical vapor deposition, (LPCVD), or plasma enhanced chemical vapor deposition, (PECVD), processing, again to a thickness between about 500 to 2000 Angstroms. Patterning of the composite oxidation mask is accomplished using conventional photolithographic and reactive ion etching, (RIE), processes. After photoresist removal, using plasma oxygen ashing, followed by careful wet cleans, a thermal oxidation is performed in an oxygen - steam ambient, at a temperature between about 800° to 1200° C., to grow between about 2000 to 8000 Angstroms of silicon dioxide in the unmasked areas. After removal of the silicon nitride mask layer, using hot phosphoric acid, and the silicon dioxide mask layer, using a buffered hydrofluoric acid solution, a silicon dioxide, gate insulator layer, 3, is thermally grown in an oxygen - steam ambient, at a temperature between about 800° to 1000° C., to a thickness between about 40 to 300 Angstroms. A polysilicon layer is next deposited using LPCVD processing, at a temperature between about 550° to 650° C., to a thickness between about 2000 to 4000 Angstroms. The polysilicon layer is doped via ion implantation processing using phosphorous, at an energy between about 30 to 100 Kev, at a dose between about 5E14 to 1E16 atoms/cm$^2$. Conventional photolithographic and RIE processing, using $Cl_2$ as an etchant, is used to create the polysilicon gate structure, 4, shown schematically in FIG. 1. After photoresist removal, via plasma oxygen ashing followed by careful wet cleans, an lightly doped, (LDD), source and drain region, 5a, is created via ion implantation of phosphorous, at an energy between about 20 to 60 Kev., at a dose between about 1E13 to 4E13 atoms/cm$^2$. A a silicon oxide layer is next grown using either LPCVD or PECVD processing, at a temperature between about 500° to 8000° C., to a thickness between about 1000 to 3000 Angstroms. A selective, anisotropic RIE procedure, using $CHF_3$ as an etchant, is employed to create insulator sidewall spacer, 6. A ion implantation procedure, using arsenic at an energy between about 50 to 100 Kev., at a dose between about 5E14 to 5E15 atoms/cm$^2$, is used to create heavily doped source and drain regions, 5b, shown in FIG. 1.

Figure 2:
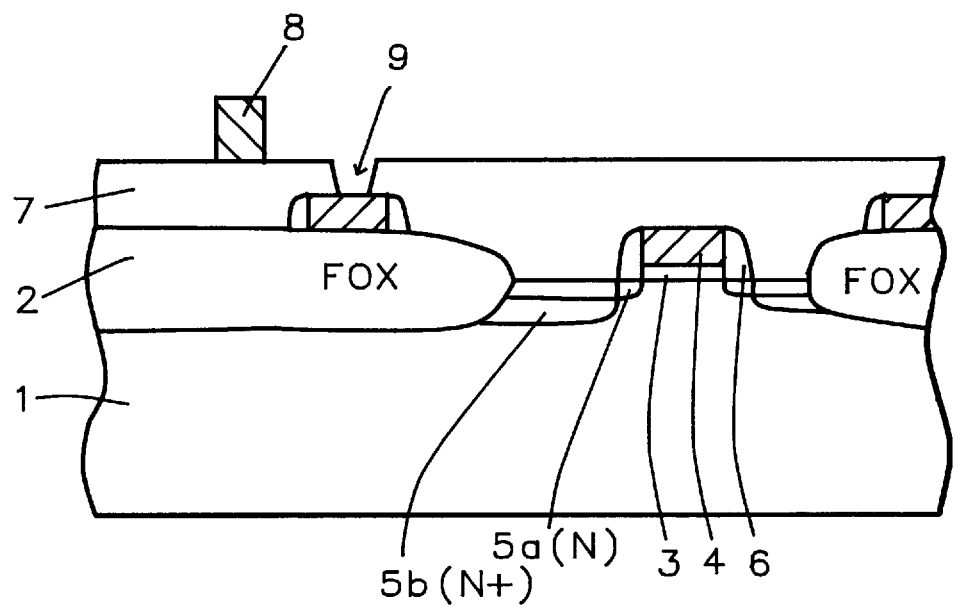
FIG. 2, which schematically, in cross-sectional form, shows the formation of a metal pillar.

A layer of silicon oxide, 7, is next deposited, again using either LPCVD or PECVD processing, at a temperature between about 500° to 800° C., to a thickness between about 7000 to 15000 Angstroms. A layer of aluminum, containing between 0.5 to 3% copper, is next deposited using r.f. sputtering, to a thickness between about 3000 to 7000 Angstroms. Another option of using LPCVD tungsten, can be exercised, again to a thickness between about 3000 to 7000 Angstroms. A third option is to use an insulator, such as silicon nitride, for the subsequent pillar structure. Photolithographic and RIE procedures, using $Cl_2$ as an etchant, are employed to create metal pillar, 8, shown schematically in FIG. 2. However if silicon nitride is used for pillar fabrication, $Cl_2$ can still be used as an etchant, resulting in the selective removal of silicon nitride, without significant etching the underlying silicon oxide layer, 7. Photoresist removal is again accomplished using plasma oxygen ashing, followed by careful wet cleans. A contact hole, 9, to polysilicon gate structure, 4, is created using conventional photolithographic and RIE processing, again using $CHF_3$ as an etchant for silicon oxide. This is shown, again in FIG. 2.

Figure 3:
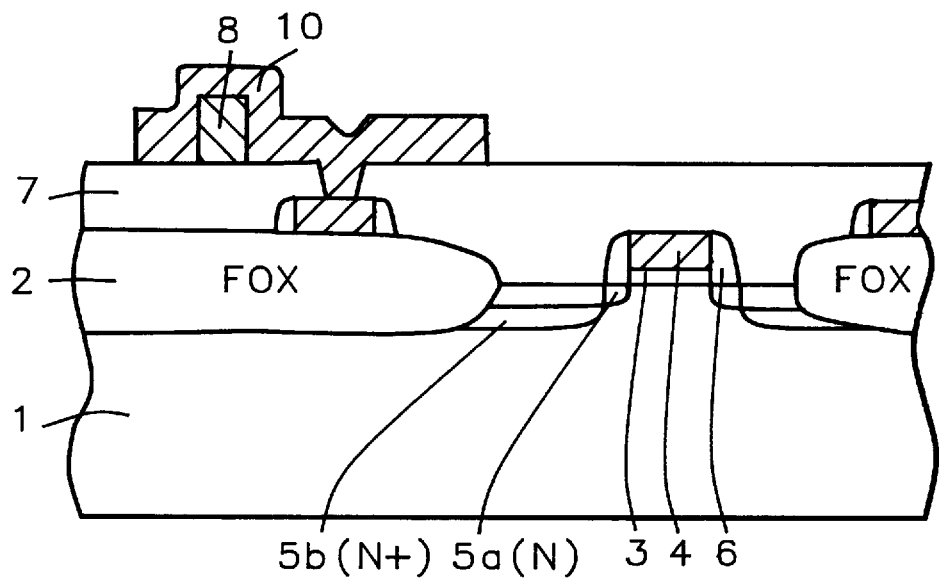
FIG. 3, which schematically, in cross-sectional form, shows the formation of a first level metallization structure.

After photoresist removal, using oxygen plasma ashing, followed by careful wet cleans, another layer of aluminum, containing between about 0.5 to 3% copper, is deposited using r.f. sputtering, to a thickness between about 3000 to 7000 Angstroms. The aluminum based layer is patterned using conventional photolithographic and RIE processing, using $Cl_2$ as an etchant, to create first level metallization structure, 10, shown schematically in FIG. 3. Photoresist removal is again accomplished via plasma oxygen ashing, followed by careful wet cleans. The first level metallization structure, 10, provides contact to polysilicon gate structure, 4, and also creates a raised region, where it overlies metal pillar, 8. This raised region also exhibits an extended surface area, or a surface area greater than the surface area of metal pillar, 8. This extended and raised area will make it easier to create a subsequent via, needed to connect the underlying first level metallization structure, 10, to a subsequent overlying metallization structure.

Figure 4:
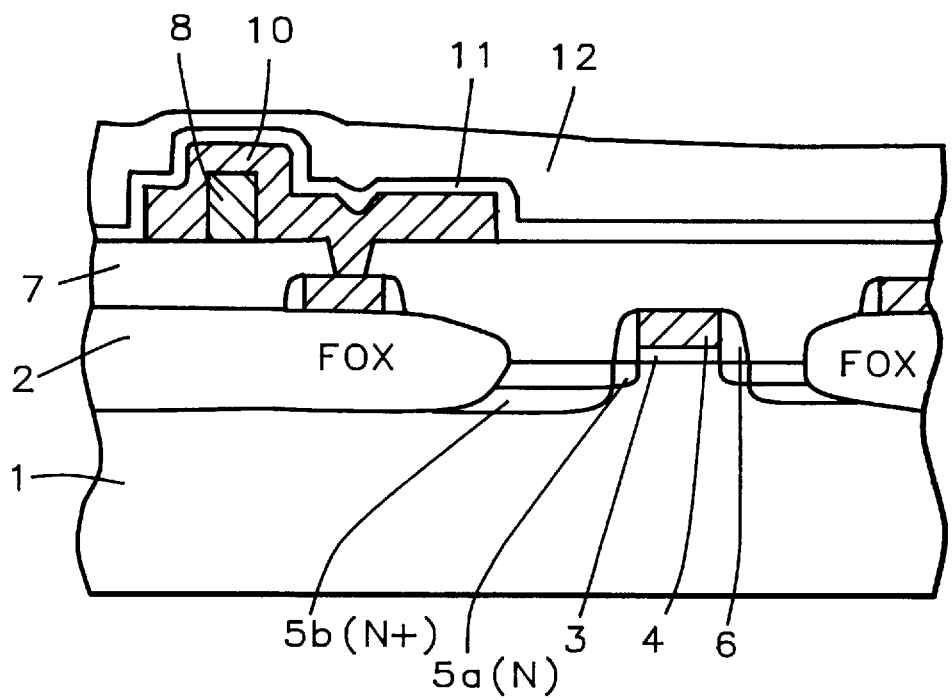
FIGS. 4–5, which schematically, in cross-sectional style, indicate the filling of the spaces between first level metallization structures, with a dielectric composite.
Figure 5:
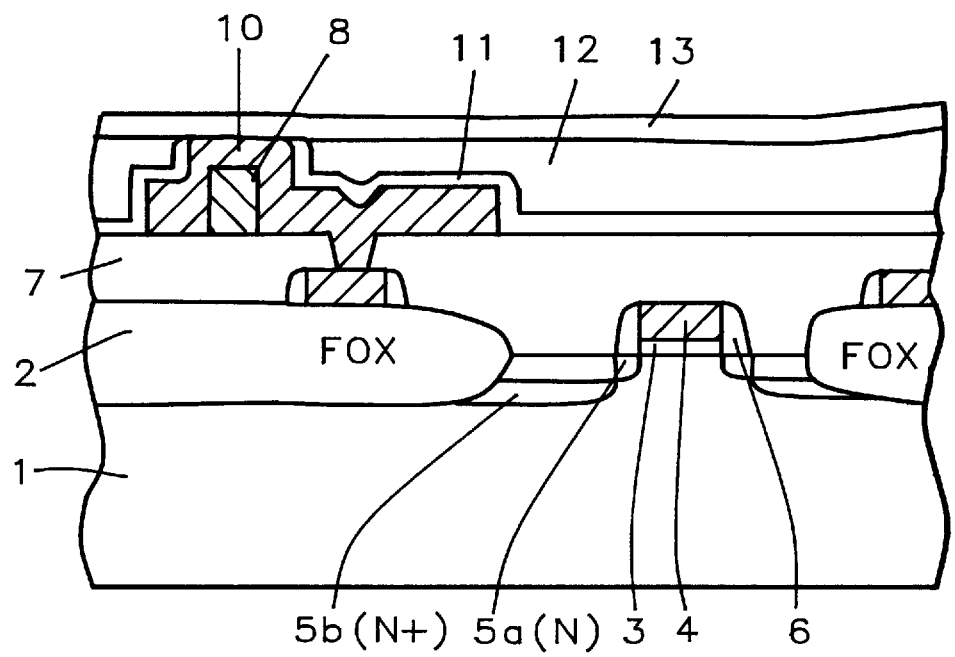

A PECVD, silicon oxide layer, 11, is next deposited, at a temperature between about 400° to 600° C., to a thickness between about 1000 to 5000 Angstroms, followed by an application of a silicon oxide, spin on glass, (SOG), layer, 12, at a thickness between about 2000 to 8000 Angstroms. This is shown in FIG. 4. The SOG layer is than treated by baking at a temperature between about 100° to 250° C., using a hot plate, followed by a curing treatment, at a temperature between about 350° to 450° C., for purposes of removing volatile components from the SOG layer. The underlying PECVD layer, 11, is used to passivate first level metallization structure, 10, while the less dense SOG layer, 12, is used to effectively fill the spaces between metal structures. A RIE procedure, using $CHF_3$ and $CF_4$, is next used to etch back the SOG layer, 12, to a point where the top surface of first level metallization structure, 10, is exposed. This is shown schematically in FIG. 5. Also shown in FIG. 5, is the deposition of another PECVD, silicon oxide layer, 13, deposited at a temperature between about 400° to 600° C., to a thickness between about 2000 to 8000 Angstroms.

Figure 6:
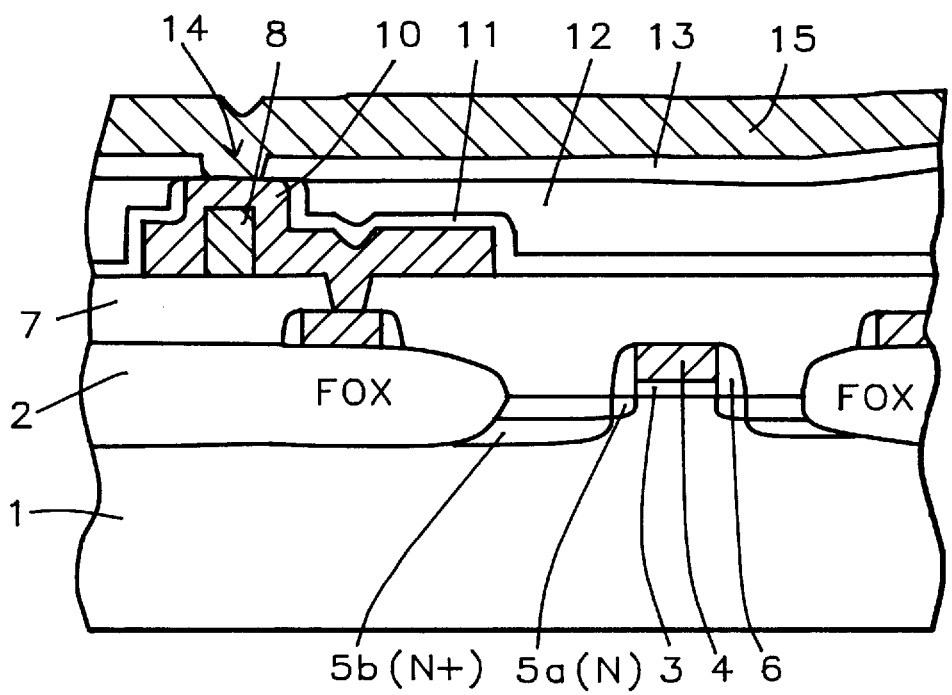
FIG. 6–7, which schematically, in cross-sectional style, show the opening of a via to the extended and raised portion of the underlying first level metallization structure, and the formation of a second level metallization structure.
Figure 7:
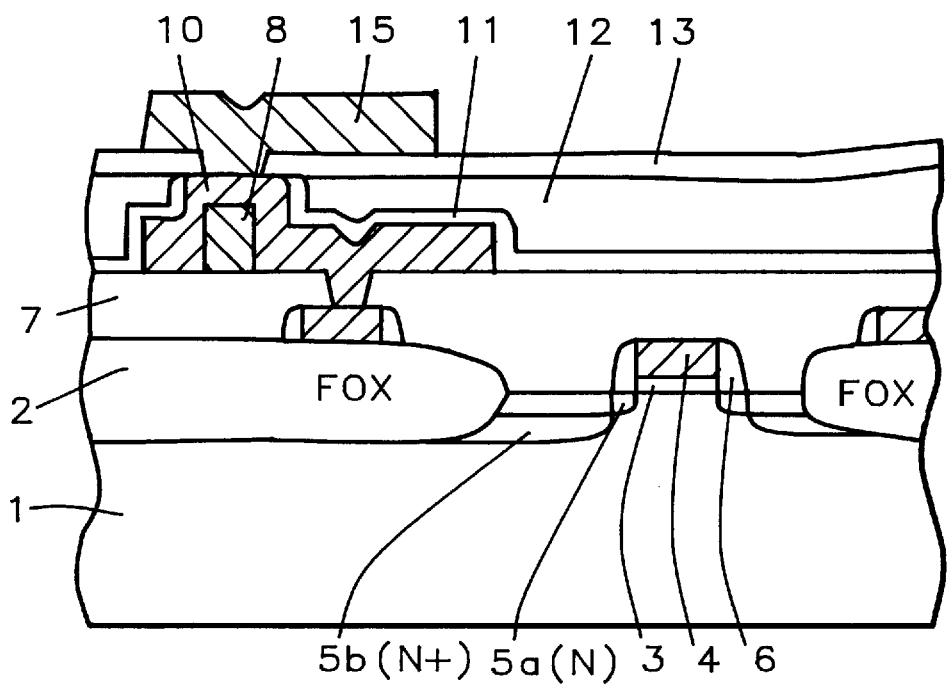

Standard photolithographic and RIE processing, using CHF₃ as an etchant, is used to create via hole, 14, in silicon oxide layer, 13. This is shown in FIG. 6. The creation of via hole, 14, has been simplified by the raised, surface area of first level metallization structure, which has been increased by incorporating an underlying metal pillar, 8. The risk of opening via hole, 14, and missing first level metallization structure, 10, has now been greatly reduced. It should be noted that the via hole opening was performed without exposing the porous SOG layer to the RIE procedure. After photoresist removal via plasma oxygen ashing, followed by careful wet cleans, a deposition of aluminum, with between about 0.5 to 3% copper, is performed using r.f. sputtering processing, to a thickness between about 3000 to 10000 Angstroms. Standard photolithographic and RIE processing, using Cl₂ as an etchant, is used to create second level metallization structure, 15, shown schematically in FIG. 7. Photoresist removal is once again accomplished via plasma oxygen ashing, followed by careful wet cleans. The deposition of the second level metallization layer was accomplished without exposure to SOG layer, 12, thus avoiding possible deleterious outgassing from the SOG layer, which can adversely influence the properties of the depositing metal.

This process for creating a via hole in a dielectric layer, to a raised and extended surface of an underlying metallization structure, although shown as part of an N channel (NFET), MOSFET device, can also be used for the fabrication of P channel, (PFET), MOSFET devices, BiCMOS devices, as well as for bipolar devices.

While this invention has been particularly shown and described with reference to, the preferred embodiments thereof, it will be understood by those skilled in the art that various changes in form and details may be made without departing from the spirit and scope of this invention.

What is claimed is:

1. A method for fabricating a MOSFET device, on a semiconductor substrate, using an optimized via hole fabrication process, comprising the steps of:

providing an element of said MOSFET device, in a first region of said semiconductor substrate;

depositing an insulator layer on said semiconductor substrate, including on said element of said MOSFET device;

deposition of a pillar metallization layer;

patterning of said pillar metallization layer to create metal pillar structure on said insulator layer, in a second region of said semiconductor substrate, with said metal pillar structure having a top surface, with a first width;

opening a contact hole in said insulator layer, in a first region of said semiconductor substrate, to said element of said MOSFET device;

deposition of a first metallization layer on said metal pillar structure, resulting in raised and extended, top surface of said first metallization layer, in areas in which said first metallization layer resides on underlying said metal pillar structure, with top surface of said first metallization layer having a second width, and deposition of said first metallization layer on exposed top surface of said element, of said MOSFET device, in said contact hole, and deposition of said first metallization layer on said insulator layer, not covered by said metal pillar structure;

patterning of said first metallization layer to create a first level metallization structure, comprised of a second portion of said first level metallization structure, overlying said metal pillar structure, in said second region of said semiconductor substrate, and comprised of a first portion of said first level metallization structure, contacting said element, of said MOSFET device, in said contact hole, in said first region of said semiconductor substrate, and resulting in said second portion of said first level metallization structure, in said second region of said semiconductor substrate, having a top surface, comprised of said second width, wider then the top surface of said underlying metal pillar structure, comprised with said first width;

deposition of a first dielectric layer on said first level metallization structure, and on said insulator layer, not covered by said first level metallization structure;

application of a spin on glass layer on said first dielectric layer, filling the spaces between first level metallization structures, and completely covering said first level metallization;

baking of said spin on glass layer;

curing of said spin on glass layer;

dry etching to remove said spin on glass material from said raised and extended top surface, on said second portion of said first level metallization structure, still leaving said spin on glass material on non-raised area of said first level metallization structure, and in spaces between said first level metallization structures;

deposition of a second dielectric layer on said raised and extended top surface, on said second portion of said first level metallization structure, and on said spin on glass, in spaces between said first level metallization structures;

opening a via hole in said second dielectric layer, to expose an area of said raised and extended, top surface, in said second portion of said first level metallization structure;

deposition of a second metallization layer on said raised and extended top surface, of said second portion of said first level metallization structure, in said via hole, and on said second dielectric layer; and patterning of said second metallization layer to form second level metallization structure, contacting said raised and extended top surface, of said second portion of said first level metallization structure, in said via hole.

2. The method of claim 1, wherein said element of said MOSFET device is a polysilicon gate structure.

3. The method of claim 1, wherein said pillar metallization layer is aluminum, containing between about 0.5 to 3% copper, deposited using r.f. sputtering, to a thickness between about 3000 to 7000 Angstroms.

4. The method of claim 1, wherein said pillar metallization is tungsten, deposited using LPCVD processing, to a thickness between about 3000 to 7000 Angstroms.

5. The method of claim 1, wherein said first metallization layer is aluminum, containing between about 0.5 to 3% copper, deposited using r.f. sputtering, to a thickness between about 3000 to 7000 Angstroms.

6. The method of claim 1, wherein said first dielectric layer is silicon oxide, deposited using PECVD processing, at a temperature between about 400° to 600° C., to a thickness between about 1000 to 5000 Angstroms.

7. The method of claim 1, wherein said spin on glass layer is applied to a thickness between about 2000 to 8000 Angstroms.

8. The method of claim 1, wherein said spin on glass layer is baked at a temperature between about 100° to 250° C., and than cured, using a furnace at a temperature between about 350° to 450° C.

9. The method of claim 1, wherein dry etching of said spin on glass is performed using $CHF_3$ and $CF_4$ as an etchant.

10. The method of claim 1, wherein said second dielectric layer is silicon oxide, deposited using PECVD processing, at a temperature between about 400° to 600° C., to a thickness between about 2000 to 8000 Angstroms.

11. The method of claim 1, wherein said second metallization layer is aluminum, containing between about 0.5 to 3% copper, deposited using r.f. sputtering, to a thickness between about 3000 to 10000 Angstroms.

12. A method for fabricating a MOSFET device, on a semiconductor substrate, using an insulator pillar, underlying a interconnect metallization level, for purposes of providing an optimized surface area for subsequent via formation, comprising the steps of:

providing a polysilicon gate structure, of said MOSFET device;

depositing an insulator layer on said semiconductor substrate, including on said polysilicon gate structure;

deposition of a pillar insulator layer;

patterning of said pillar insulator layer to create an insulator pillar structure on said insulator layer, in a second region of said semiconductor substrate, with said pillar insulator having a top surface with a first width;

opening a contact hole in said insulator layer, to said polysilicon gate structure, in a first region of said semiconductor substrate;

deposition of a first metallization layer on said insulator pillar structure, resulting in a raised and extended top surface of said first metallization layer, in an area in which said first metallization layer overlies said insulator pillar structure, with the top surface of said first metallization layer having a second width, deposition of said first metallization layer on exposed top surface of said polysilicon gate structure, in said contact hole, and deposition of said first metallization layer on said insulator layer, not covered by said insulator pillar structure;

patterning of said first metallization layer to create a first level metallization structure, comprised of a second portion of said first metallization structure, overlying said insulator pillar structure, in said second region of said semiconductor substrate, and comprised of a first portion of said first level metallization structure, providing contact to said polysilicon gate structure, with said second portion of said first level metallization structure having a top surface, comprised of said second width, wider then top surface of said insulator pillar;

deposition of a first PECVD dielectric layer on said first level metallization structure, and on said insulator layer, not covered by said first level metallization structure;

application of a spin on glass layer on said first PECVD dielectric layer, filling spaces between first level metallization structures, and completely covering said first level metallization structure;

baking of said spin on glass layer;

curing of said spin on glass layer;

dry etching to remove said spin on glass layer from said raised and extended top surface of said second portion of said first level metallization structure, still leaving said spin on glass material on non-raised and extended areas of said first level metallization structure, and leaving said spin on glass material in spaces between said first level metallization structures;

deposition of a second PECVD dielectric layer on said raised and extended top surface of said second portion of said first level metallization structure, and on said spin on glass, in spaces between said first level metallization structures;

opening a via hole in said second PECVD dielectric layer, to expose an area of said raised and extended top surface, in said second portion of said first level metallization structure;

deposition of a second metallization layer on said raised and extended top surface, in said second portion of said first level metallization structure, in said via hole, and on said second PECVD dielectric layer; and patterning of said second metallization layer to create second level metallization structure, contacting said raised and extended top surface, in said second portion of said first level metallization structure, in said via hole.

13. The method of claim 12, wherein said insulator pillar layer is silicon nitride, deposited using LPCVD processing, at a temperature between about 600° to 800° C., to a thickness between about 3000 to 7000 Angstroms.

14. The method of claim 12, wherein said silicon nitride is etched using anisotropic, RIE procedures, using $Cl_2$ as an etchant.

15. The method of claim 12, wherein said first metallization layer is aluminum, containing between about 0.5 to 3% copper, deposited using r.f. sputtering, to a thickness between about 3000 to 7000 Angstroms.

16. The method of claim 12, wherein said first PECVD dielectric layer is silicon, deposited at a temperature between about 400° to 600° C., to a thickness between about 1000 to 5000 Angstroms.

17. The method of claim 12, wherein said spin on glass layer is applied to a thickness between about 2000 to 8000 Angstroms.

18. The method of claim 12, wherein said spin on glass layer is baked at a temperature between about 100° to 250° C., and than cured at a temperature between about 350° to 450° C., using a furnace.

19. The method of claim 12, wherein dry etching of said spin on glass is performed using $CHF_3$ and $CF_4$ as an etchant.

20. The method of claim 12, wherein said second PECVD dielectric layer is silicon oxide, deposited at a temperature between about 400° to 600° C., to a thickness between about 2000 to 8000 Angstroms.

21. The method of claim 12, wherein said second metallization layer is aluminum, containing between about 0.5 to 3% copper, deposited using r.f. sputtering, to a thickness between about 3000 to 10000 Angstroms.

22. A MOSFET device structure, comprising;

field oxide regions on the surface of a semiconductor substrate;

a device region between said field oxide regions;

a polysilicon gate structure on said semiconductor substrate, in center of said device region;

another said polysilicon gate structure on said field oxide region;

an insulator sidewall spacer located on sides of said polysilicon gate structures;

source and drain regions in the surface of said semiconductor substrate, between said polysilicon gate structure in said device region, and said field oxide regions;

an insulator layer on said polysilicon gate structure on said field oxide region, on said polysilicon gate structure in said device region, on said source and drain regions, and on said field oxide region, not covered by said polysilicon gate structure;

a contact hole in said insulator layer, to said polysilicon gate structure on said field oxide region;

a pillar structure on said field oxide region;

a first level metallization structure, contacting said polysilicon gate structure in said contact hole, and overlying said pillar structure, resulting in a raised and extended surface where said first level metallization structure overlies said pillar structure;

composite dielectric material in spaces between said first level metallization structures;

a dielectric layer, covering composite dielectric material in spaces between said first level metallization structures, and covering said raised and extended surface of said first level metallization structure;

a via hole in said dielectric layer, to said raised and extended surface of said first level metallization structure; and a second level metallization structure contacting said raised and extended surface of said first metallization structure, in said via hole.

23. The MOSFET device structure of claim 22, wherein said pillar structure is fabricated from aluminum, containing between about 0.5 to 3% copper, at a thickness between about 3000 to 7000 Angstroms.

24. The MOSFET device structure of claim 22, wherein said pillar structure is fabricated from tungsten, at a thickness between about 3000 to 7000 Angstroms.

25. The MOSFET device structure of claim 22, wherein said pillar structure is fabricated from silicon nitride, at a thickness between about 3000 to 7000 Angstroms.

26. The MOSFET device structure of claim 22, wherein said composite dielectric material, used to fill spaces between said first level metallization structures is; a PECVD silicon oxide layer, and a spin on glass layer.

* * * * *